United States Patent
Lin et al.

(10) Patent No.: US 8,107,340 B2
(45) Date of Patent: Jan. 31, 2012

(54) ELECTRONIC APPARATUS WITH ADJUSTABLE POWER CONSUMPTION

(75) Inventors: Yu-Hsuan Lin, Hsinchu (TW); Tzu-Chieh Lin, Hsinchu (TW); Yuh Cheng, Hsinchu County (TW); Tysh-Bin Liu, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 148 days.

(21) Appl. No.: 12/542,911

(22) Filed: Aug. 18, 2009

(65) Prior Publication Data
US 2011/0044145 A1 Feb. 24, 2011

(51) Int. Cl.
*G11B 7/00* (2006.01)
(52) U.S. Cl. ...................................... 369/59.21
(58) Field of Classification Search .......... None
See application file for complete search history.

(56) References Cited

U.S. PATENT DOCUMENTS

| | | | |
|---|---|---|---|
| 4,129,864 A * | 12/1978 | Carpenter et al. ............ 341/139 |
| 5,249,169 A * | 9/1993 | Ogawa ........................ 369/44.34 |
| 5,978,333 A | 11/1999 | Kobayashi et al. |
| 6,340,944 B1 | 1/2002 | Chang et al. |
| 2003/0035352 A1 * | 2/2003 | Worthington .............. 369/47.35 |
| 2006/0083136 A1 | 4/2006 | Lee |
| 2007/0026829 A1 | 2/2007 | Kim et al. |
| 2007/0211364 A1 | 9/2007 | Dean |
| 2007/0291621 A1 | 12/2007 | Aoyama et al. |
| 2007/0296623 A1 * | 12/2007 | Ogita et al. ................... 341/172 |
| 2009/0034112 A1 | 2/2009 | Hashizume |

FOREIGN PATENT DOCUMENTS

CN 1779815 5/2006

OTHER PUBLICATIONS

"Fully Integrated CMOS SoC for 56/18/16 CD/DVD-dual/RAM Applications with On-Chip 4-LVDS Channel WSG and 1.5Gb/s SATA PHY" Jyh-Shin Pan et al., Session 14/Baseband and Channel Processing/14.8, ISSCC 2006.

English language translation of abstract of CN 1779815 (published May 31, 2006).

* cited by examiner

*Primary Examiner* — Joseph Haley
(74) *Attorney, Agent, or Firm* — Thomas|Kayden

(57) ABSTRACT

The invention provides an electronic apparatus. In one embodiment, the electronic apparatus comprises an analog-to-digital converter (ADC) and an enable device. The analog-to-digital converter converts an analog input signal to a digital output signal with a resolution having a plurality of bits. The enable device dynamically adjusts the resolution of the analog-to-digital converter according to an instruction signal.

10 Claims, 9 Drawing Sheets

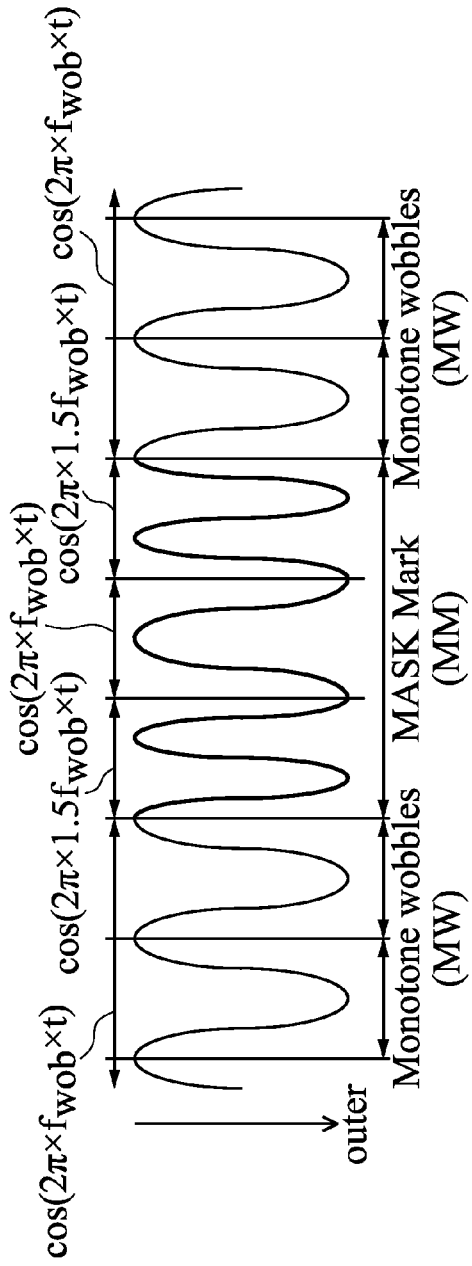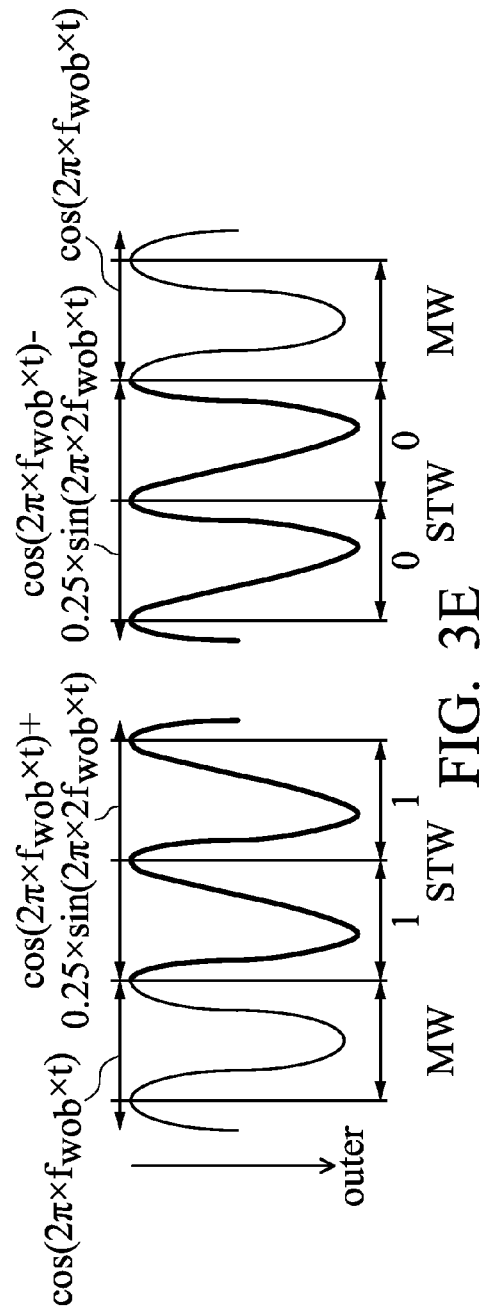
FIG. 3D
FIG. 3E

| BITDN_EN | Thermal Code | Binary Code |
|---|---|---|
| BITDN_EN=0 | 0000000 | 000 |
| | 0000001 | 001 |
| | 0000011 | 010 |
| | 0000111 | 011 |
| | 0001111 | 100 |
| | 0011111 | 101 |
| | 0111111 | 110 |
| | 1111111 | 111 |
| BITDN_EN=1 | 0000001 | 001 |
| | 0000111 | 011 |
| | 0011111 | 101 |
| | 1111111 | 111 |

FIG. 4B

ELECTRONIC APPARATUS WITH ADJUSTABLE POWER CONSUMPTION

BACKGROUND OF THE INVENTION

1. Field of the Invention

The invention relates to power consumption reduction of an electronic apparatus, and more particularly to power consumption reduction of an electronic apparatus with analog-to-digital converters.

2. Description of the Related Art

Analog-to-digital converters (ADC) are used to convert analog input signals to digital output signals. Because an analog processing circuit has shortcomings of a larger circuit size and higher circuit complexity in comparison with a corresponding digital processing circuit, analog signals of an electronic apparatus are usually converted into digital signals with analog-to-digital converters before being processed by a digital signal processor or a microcontroller.

Optical disk drives also comprise analog-to-digital converters for signal conversion. To access data stored in an optical disk, an optical disk drive projects a laserbeam onto a surface of the optical disk, and photodetectors of a pickup head then detect amplitudes of the laserbeam reflected from the surface to obtain reflection signals. The reflection signals are then processed by a wobble detection circuit to generate a wobble signal. Referring to FIG. 1, a block diagram of a conventional wobble detection circuit 100 of an optical disk drive is shown. Four photodetectors first respectively generates reflection signals A, B, C, and D. A summing block 101 then sums the reflection signals A and D to obtain a signal ADO. Accordingly, a summing block 102 sums the reflection signals B and C to obtain a signal BCO.

Offset cancellation blocks 103 and 104 then remove DC components from the signals ADO and BCO to obtain signals OFF_ADO and OFF_BCO. Low pass filters 105 and 106 then remove noise components from the signals OFF_ADO and OFF_BCO to obtain signals LPF1O and LPF2O. Partial gain amplifiers 107 and 108 then adjust amplitude of the signals LPF1O and LPF2O to obtain signals PGA1O and PGA2O. Analog-to-digital converters 109 and 110 then digitize the signals PGA1O and PGA2O to obtain signals ADC1O and ADC2O. Automatic gain control units 111 and 112 respectively determine gain AGCCON1O and AGCCON2O of the partial gain amplifiers 107 and 108 according to the signals ADC1O and ADC2O.

A subtraction block 117 then subtracts the signal ADC2O from the signal ADC1O to obtain a signal SUBO. The signal SUBO can be further processed to extract wobble information. A low pass filter LPF3 filters out a noise component from the signal SUBO to obtain a signal LPF3O. The signal LPF3O can be directly used to extract phase modulated address information (ADIP). The signal LPF3O is also delivered to a band pass filter 119 which generates a signal BPFO. The signal BPFO can be used to extract channel bit clock information. The signal LPF3O is also delivered to a land pre-pit determining block 120 which generates a signal LPPO. The signal LPPO can be used to extract land prepit address information.

Because portable electronic devices have limited power resource supplied by batteries, power consumption is an important issue for portable electronic devices such as notebook computers, cell phones, and personal digital assistants (PDA). The ordinary electronic devices comprise analog-to-digital converters, power consumption of the electronic devices is reduced if power consumption of the analog-to-digital converters therein is reduced. For example, when power consumption of the analog-to-digital converters 109 and 110 shown in FIG. 1 is reduced, an optical disk drive comprising the analog-to-digital converters 109 and 110 also show reduced power consumption. Thus, an electronic apparatus comprising analog-to-digital converters with adjustable power consumption is required.

BRIEF SUMMARY OF THE INVENTION

The invention provides an electronic apparatus. In one embodiment, the electronic apparatus comprises an analog-to-digital converter (ADC) and an enable device. The analog-to-digital converter converts an analog input signal to a digital output signal with a resolution having a plurality of bits. The enable device dynamically adjusts the resolution of the analog-to-digital converter.

The invention also provides an electronic apparatus. In one embodiment, the electronic apparatus comprises an analog-to-digital converter (ADC), a frequency generator, and a controller. The analog-to-digital converter converts an analog input signal to a digital output signal with a sampling rate determined by a clock signal. The frequency generator generates the clock signal. The controller directs the frequency generator to dynamically adjust the frequency of the clock signal to adjust the sampling rate of the analog-to-digital converter.

The invention provides an optical disk drive. In one embodiment, the optical disk drive comprises a photodetector integrated circuit (PDIC), an automatic gain controller (AGC), an analog-to-digital converter (ADC), and a current adjusting circuit. The photodetector integrated circuit detects amplitude of a reflection signal from an optical disk to obtain a first wobble signal. The automatic gain controller amplifies the first wobble signal to obtain a second wobble signal. The analog-to-digital converter converts the second wobble signal from analog to digital to obtain a third wobble signal. The current adjusting circuit dynamically adjusts levels of currents driving the automatic gain controller and the analog-to-digital converter.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3D shows a wobble signal of a blu-ray R/RW disk modulated according to MSK modulation;

FIG. 3E shows a wobble signal of a blu-ray R/RW disk modulated according to sawtooth modulation;

FIG. 4B shows a table listing thermal code bits and corresponding binary codes;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
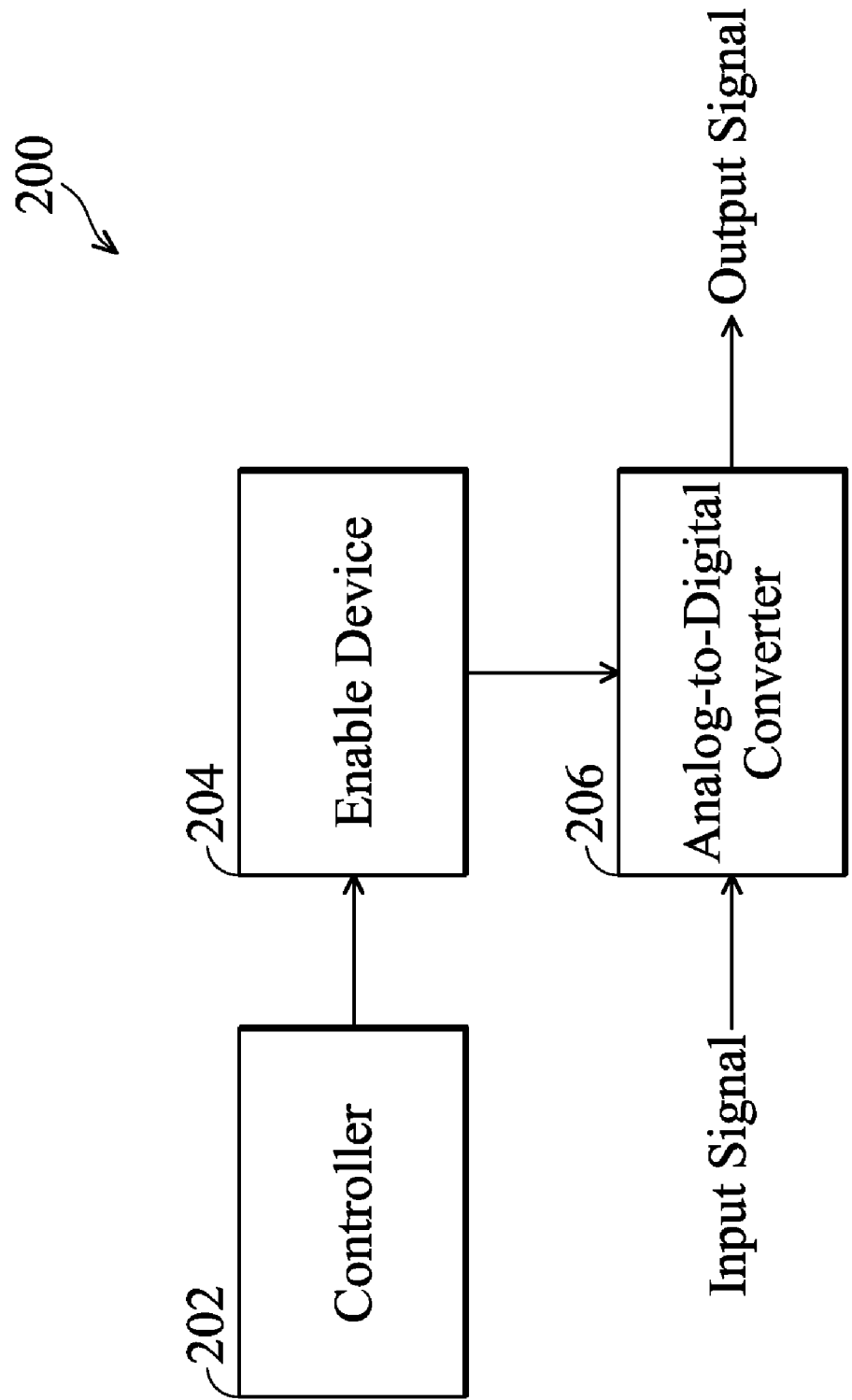
FIG. 2 is a block diagram of an embodiment of an electronic apparatus comprising an analog-to-digital converter with adjustable digitizing resolution according to the invention.

Referring to FIG. 2, a block diagram of an embodiment of an electronic apparatus 200 comprising an analog-to-digital converter 206 with adjustable digitizing resolution according to the invention is shown. The electronic apparatus 200 comprises a controller 202, an enable device 204, and the analog-to-digital converter (ADC) 206. The controller 202 generates an instruction signal to direct the enable device 204 to adjust resolution of the analog-to-digital converter 206. In one embodiment, the instruction signal comprises a bit number of the resolution of the analog-to-digital converter 206. The enable device 204 then dynamically adjusts the resolution of the analog-to-digital converter 206 according to the instruction signal.

In one embodiment, when the instruction signal indicates a resolution with a larger bit number, the enable device 204 enables a greater circuit portion of the analog-to-digital converter 206. The analog-to-digital converter 206 then converts an analog input signal to a digital output signal according to the resolution set by the enable device 204. The analog-to-digital converter 206 therefore generates a digital output signal with resolution which is dynamically adjusted. When the analog-to-digital converter 206 has a high digitizing resolution, a greater circuit portion of the analog-to-digital converter 206 is enabled, and the analog-to-digital converter 206 requires greater power for analog-to-digital conversion. When the analog-to-digital converter 206 has a low digitizing resolution, a smaller circuit portion of the analog-to-digital converter 206 is disabled by the enable device 204, and the analog-to-digital converter 206 requires lesser power for analog-to-digital conversion. The power consumption of the analog-to-digital converter 206 can therefore be dynamically adjusted by the controller 202.

Figure 1:
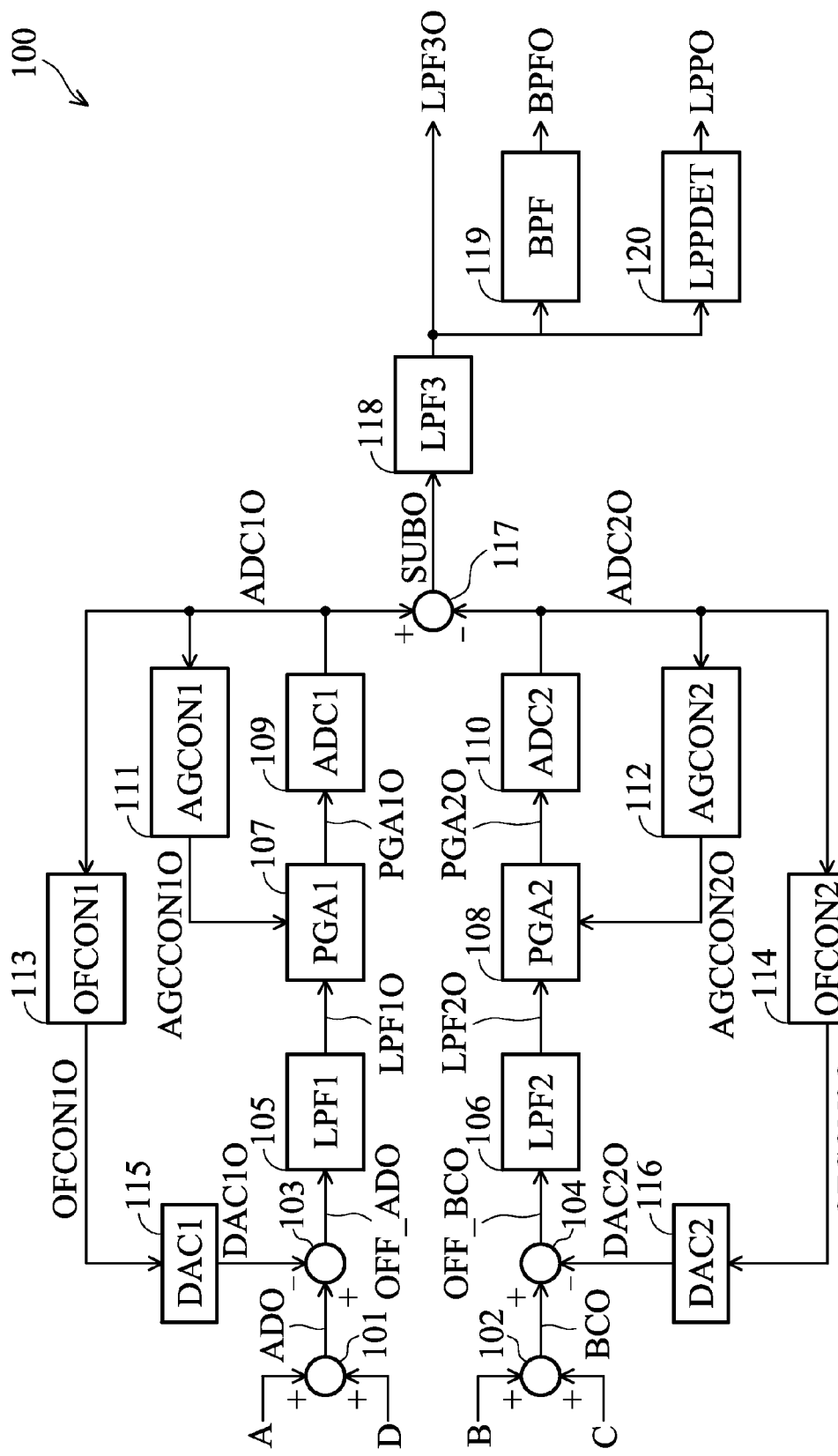
FIG. 1 is a block diagram of a conventional wobble detection circuit of an optical disk drive.

In one embodiment, the electronic apparatus 200 is an optical disk drive, and the analog input signal is an analog wobble signal. For example, the analog-to-digital converter 206 may be the analog-to-digital converter 109 or the analog-to-digital converter 110 shown in FIG. 1 for wobble signal processing. The controller 202 may determine the resolution of the analog-to-digital converter 206 according to various conditions. In one embodiment, because wobble signals read from different media types of optical disks require different levels of signal resolution, the controller 202 determines the resolution of the analog-to-digital converter 206 according to a media type which indicates a format of an optical disk read by the optical disk drive.

Figure 3A:
FIG. 3A shows a wobble signals of a DVD+R/RW disk.
Figure 3B:
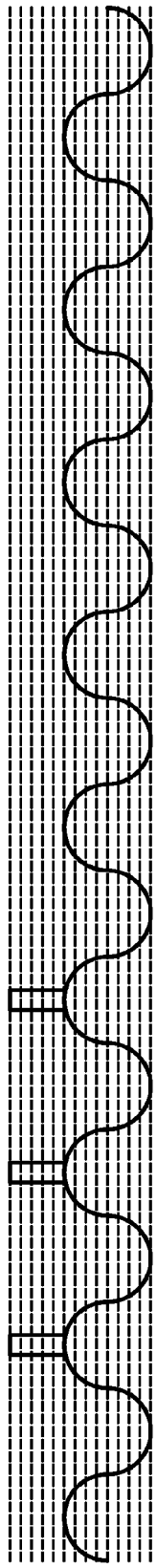
FIG. 3B shows a wobble signal of a DVD-R/RW disk.
Figure 3C:
FIG. 3C shows a wobble signal of a CD-R/RW disk.

Referring to FIGS. 3A, 3B, and 3C, wobble signals of a DVD+R/RW disk, a DVD-R/RW disk, and a CD-R/RW disk are respectively shown. Because an analog wobble signal of a DVD+R/RW disk is modulated according to phase modulation as shown in FIG. 3A, a digitized wobble signal with resolution of a small bit number can carry complete phase information of the original analog wobble signal. The controller 202 therefore directs the enable device 204 to set the analog-to-digital converter 206 with a low resolution when the media type of the optical disk is DVD+R/RW.

On the other hand, because an analog wobble signal of a DVD-R/RW disk carries land-prepit information which appears as spikes on the top of the analog wobble signal as shown in FIG. 3B, a digitized wobble signal corresponding to the DVD-R/RW disk has resolution with a large bit number to carry complete land-prepit information of the original analog wobble signal. The controller 202 therefore directs the enable device 204 to set the analog-to-digital converter 206 with a high resolution when the media type of the optical disk is DVD-R/RW. The analog wobble signal of a CD-R/RW disk is modulated according to frequency modulation as shown in FIG. 3C, and a digitized wobble signal with resolution of a small bit number can carry complete frequency information of the original analog wobble signal. The controller 202 directs the enable device 204 to set the analog-to-digital converter 206 with a low resolution when the media type of the optical disk is CD-R/RW. In one embodiment, the controller 202 determines that a 3-bit resolution is required for converting a DVD+R/RW wobble signal, a 6-bit or 7-bit resolution is required for converting a DVD-R/RW wobble signal, and a 3-bit resolution is required for converting a CD-R/RW wobble signal.

When an optical disk is a blu-ray R/RW disk, the wobble signal obtained from the optical disk may be modulated according to minimum shift keying (MSK) modulation or sawtooth modulation. Referring to FIGS. 3D and 3E, wobble signals of a blu-ray R/RW disk modulated according to MSK modulation and sawtooth modulation are respectively shown. The frequency of the wobble signal corresponding to MSK modulation may be changed to be a high frequency $1.5f_{wob}$ which is 1.5 times that of a basic wobble frequency $f_{wob}$, as shown in FIG. 3D. The wobble signal corresponding to sawtooth modulation may carry a sine wave with a double frequency $2f_{wob}$ and a positive amplitude, and may carry a sine wave with a double frequency $2f_{wob}$ and a negative amplitude. To store the MSK modulation information and the sawtooth modulation information, the analog-to-digital converter 206 therefore must be set with a higher resolution. In one embodiment, the controller 202 determining a 4-bit resolution is required for converting a blu-ray R/RW wobble signal with MSK modulation, and a 5-bit resolution is required for converting a blu-ray R/RW wobble signal with sawtooth modulation.

When the electronic apparatus 200 is an optical disk drive and the analog input signal is a wobble signal, the controller 202 can further determine the resolution of the analog-to-digital converter 206 according to other variables in additional to the media type of an optical disk. In one embodiment, the controller 202 also determines the resolution of the analog-to-digital converter 206 according to a disk type which indicates whether the optical disk is a data disk storing data or a blank disk storing no data. When the optical disk is a blank disk, a wobble signal read from the blank disk carries only wobble information, and the analog-to-digital converter 206 can digitize the wobble signal according to a resolution with a small bit number. When the optical disk is a data disk, a wobble signal read from the data disk carries only data in addition to wobble information, and the analog-to-digital converter 206 digitizes the wobble signal according to a resolution with a larger bit number. The controller 202 therefore increases the bit number of the resolution when the optical disk is a data disk, and decreases the bit number of the resolution when the optical disk is a blank disk.

In one embodiment, the controller 202 also determines the resolution of the analog-to-digital converter 206 according to a wobble decoding status. After the analog-to-digital converter 206 converts the analog input signal to a digital output signal, the digital output signal is decoded in a decoding process to obtain data stored in the digital wobble signal, and a wobble decoding status of the decoding process is obtained. When the wobble decoding status indicates that an error rate of the decoding process is low, the controller 202 can decrease the bit number of the resolution of the analog-to-digital converter 206 for power consumption reduction. When the wobble decoding status indicates that an error rate of the decoding process is high, the controller 202 increases the bit number of the resolution of the analog-to-digital converter 206, thus enabling the analog-to-digital converter 206 to generate the digital output signal with a better quality to decrease the error rate of the decoding process.

Figure 4A:
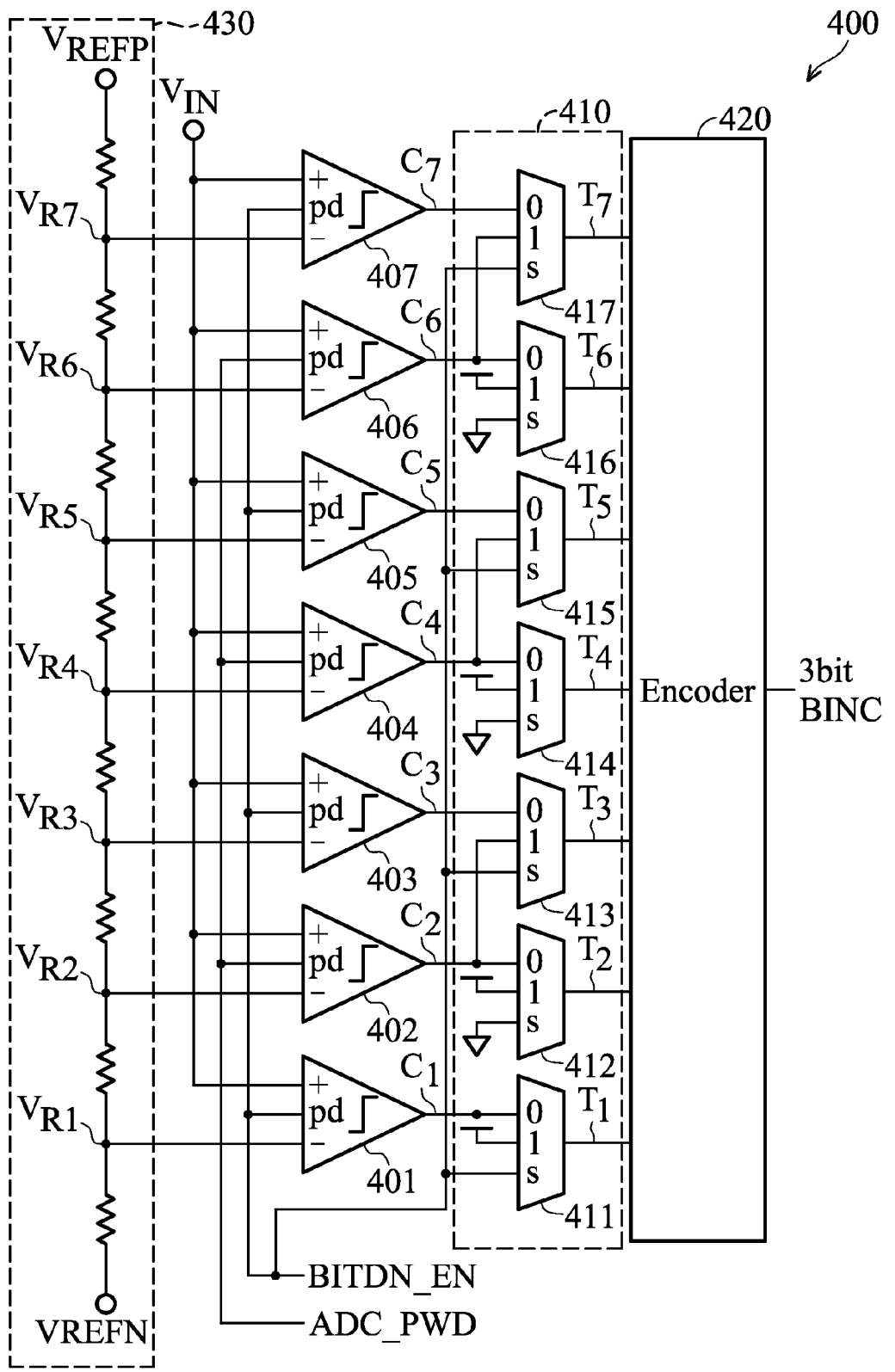
FIG. 4A is a circuit diagram of an analog-to-digital converter and an enable device according to the invention.

Referring to FIG. 4A, a circuit diagram 400 of an analog-to-digital converter and an enable device 410 according to the invention is shown. In one embodiment, the analog-to-digital converter comprises a string resistor ladder 430, a plurality of comparators 401~407, and an encoder 420, and the enable device 410 comprises a plurality of multiplexers 411~417. A controller generates an instruction signal comprising a bit down enable signal BITDN_EN to determine whether to reduce resolution of the analog-to-digital converter shown in FIG. 4A. The enable device 410 corresponds to the enable device 204 shown in FIG. 2 and adjusts the resolution of the analog-to-digital converter shown in FIG. 4A according to the bit down enable signal BITDN_EN. The analog-to-digital converter shown in FIG. 4A corresponds to the analog-to-digital converter 206 shown in FIG. 2 and converts an analog input signal $V_{IN}$ into a 3-bit binary code signal BINC as a digital output signal.

First, the string resistor ladder 430 generates a plurality of reference voltages $V_{R1}$~$V_{R7}$ with levels between a positive reference voltage $V_{REFP}$ and a negative reference voltage $V_{REFN}$. The comparators 401~407 then respectively compare the analog input signal $V_{IN}$ with the reference voltages $V_{R1}$~$V_{R7}$ to generate a plurality of comparison result bits $C_1$~$C_7$. The bit down enable signal BITDN_EN generated by the controller determines whether to reduce the resolution of the analog-to-digital converter. When the bit down enable signal BITDN_EN is disabled, the multiplexers 411~417 of the enable device 410 directly deliver the comparison result bits $C_1$~$C_7$ to the encoder 420. The encoder 420 then gathers the comparison result bits $C_1$~$C_7$ to obtain a plurality of thermal code bits $T_1$~$T_7$, and converts the thermal code bits $T_1$~$T_7$ to obtain the 3-bit binary code signal BINC as the digital output signal.

When the bit down enable signal BITDN_EN is enabled, comparators 401, 403, 405, and 407 are disabled, thereby reducing power consumption of the analog-to-digital converter. The comparison result bits $C_1$, $C_3$, $C_5$, and $C_7$ are therefore unavailable when the bit down enable signal BITDN_EN is enabled. The multiplexers 411, 413, 415, and 417 of the enable device 410 then respectively forward the comparison result bits 1, $C_2$, $C_4$, and $C_6$ to the encoder 420 as the thermal code bits $T_1$, $T_3$, $T_5$, and $T_7$. The multiplexers 412, 414, and 416 forward the comparison result bits $C_2$, $C_4$, and $C_6$ to the encoder 420 as the thermal code bits $T_2$, $T_4$, and $T_6$. The encoder 420 therefore obtains an entire set of thermal code bits T1~T7 for generating the binary code BINC as the digital output signal of the analog-to-digital converter. The binary code BINC, however, contains only two bits of available information, and a least significant bit of the binary code BINC is neglected. Referring to FIG. 4B, a table listing the thermal code bits and the corresponding binary codes is shown. When the bit down enable signal BITDN_EN is enabled, because four comparators 401, 403, 405, and 407 detected from the seven comparators 401~407 are disabled, power consumption of the analog-to-digital converter is reduced by 57%.

Figure 5:
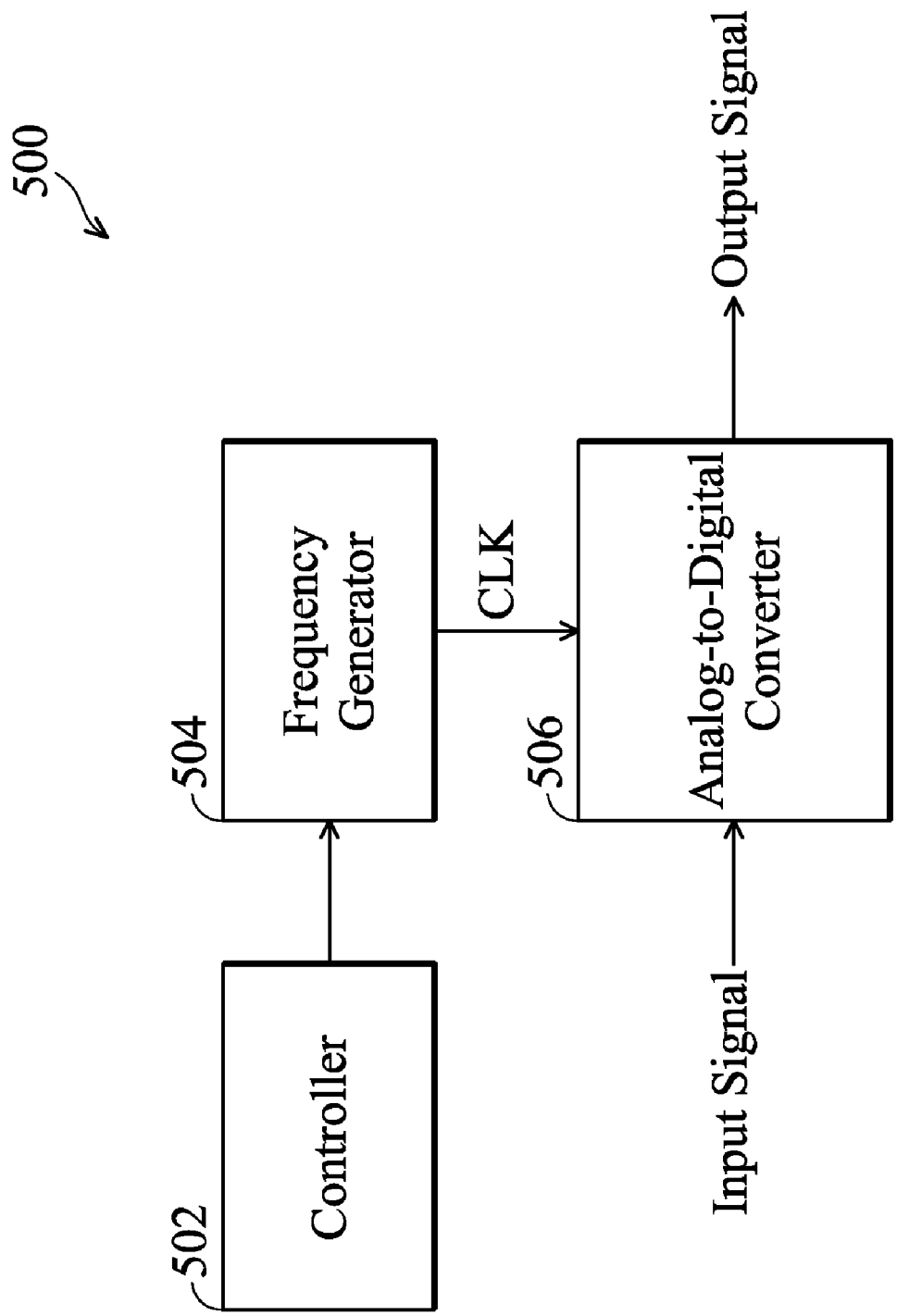
FIG. 5 is a block diagram of an embodiment of an electronic apparatus comprising an analog-to-digital converter with an adjustable sampling rate according to the invention.

The embodiments shown in FIGS. 2, 4A and 4B dynamically change the resolution of an analog-to-digital converter for power consumption reduction. Power consumption of an analog-to-digital converter can also be reduced by decreasing a sampling rate of the analog-to-digital converter. Referring to FIG. 5, a block diagram of an embodiment of an electronic apparatus 500 comprising an analog-to-digital converter 506 with an adjustable sampling rate according to the invention is shown. The electronic apparatus 500 comprises a controller 502, a frequency generator 504, and the analog-to-digital converter (ADC) 506.

The frequency generator 504 generates a clock signal CLK. The analog-to-digital converter 506 converts an analog input signal to a digital output signal with a sampling rate determined by the clock signal CLK. The controller 502 directs the frequency generator 504 to dynamically adjust the frequency of the clock signal CLK to adjust the sampling rate of the analog-to-digital converter 506. The analog-to-digital converter 506 therefore generates a digital output signal with a sampling rate which is dynamically adjusted. When the analog-to-digital converter 506 digitizes the analog input signal according to a high sampling rate, the analog-to-digital converter 506 has heavier signal processing loads and requires a higher power for analog-to-digital conversion. On the contrary, when the analog-to-digital converter 506 digitizes the analog input signal according to a low sampling rate, the analog-to-digital converter 506 has lighter signal processing loads and requires lesser power for analog-to-digital conversion. The power consumption of the analog-to-digital converter 506 can therefore be dynamically adjusted by the controller 502.

In one embodiment, the electronic apparatus 500 is an optical disk drive, and the input signal is an analog wobble signal. The controller 502 determines the sampling rate of the analog-to-digital converter 506 according to various variables, such as a media type indicating a format of an optical disk read by the optical disk drive. Wobble signals corresponding to different media types carry different amount of information and require different sampling rates for digitization. In one embodiment, the controller 502 determines the sampling rate of the analog-to-digital converter 506 to be 16 samples per wobble cycle when the media type is a DVD+R/RW format, determines the sampling rate to be 93 samples per wobble cycle when the media type is the DVD-R/RW format, and determines the sampling rate to be 98 samples per wobble cycle when the media type is the CD-R/RW format.

In another embodiment, the controller 502 also determines the sampling rate of the analog-to-digital converter 506 according to a disk type about whether an optical disk is a data disk storing data or a blank disk storing no data. For example, when the optical disk is a data disk, the analog input signal carries data in addition to wobble information, and the controller 502 increases the sampling rate of the analog-to-digital converter 506. When the optical disk is a blank disk, the analog input signal carries only wobble information, and the controller 502 decreases the sampling rate of the analog-to-digital converter 506. In another embodiment, the controller 502 also determines the sampling rate according to a wobble decoding status of a decoding process. For example, when the wobble decoding status indicates that an error rate of the decoding process is low, the controller 502 can decrease the sampling rate of the analog-to-digital converter 506 for power consumption reduction. When the wobble decoding status indicates that an error rate of the decoding process is high, the controller 502 increases the sampling rate of the analog-to-digital converter 506, thus enabling the analog-to-digital converter 506 to generate the digital output signal with a better quality to decrease the error rate of the decoding process.

Figure 6A:
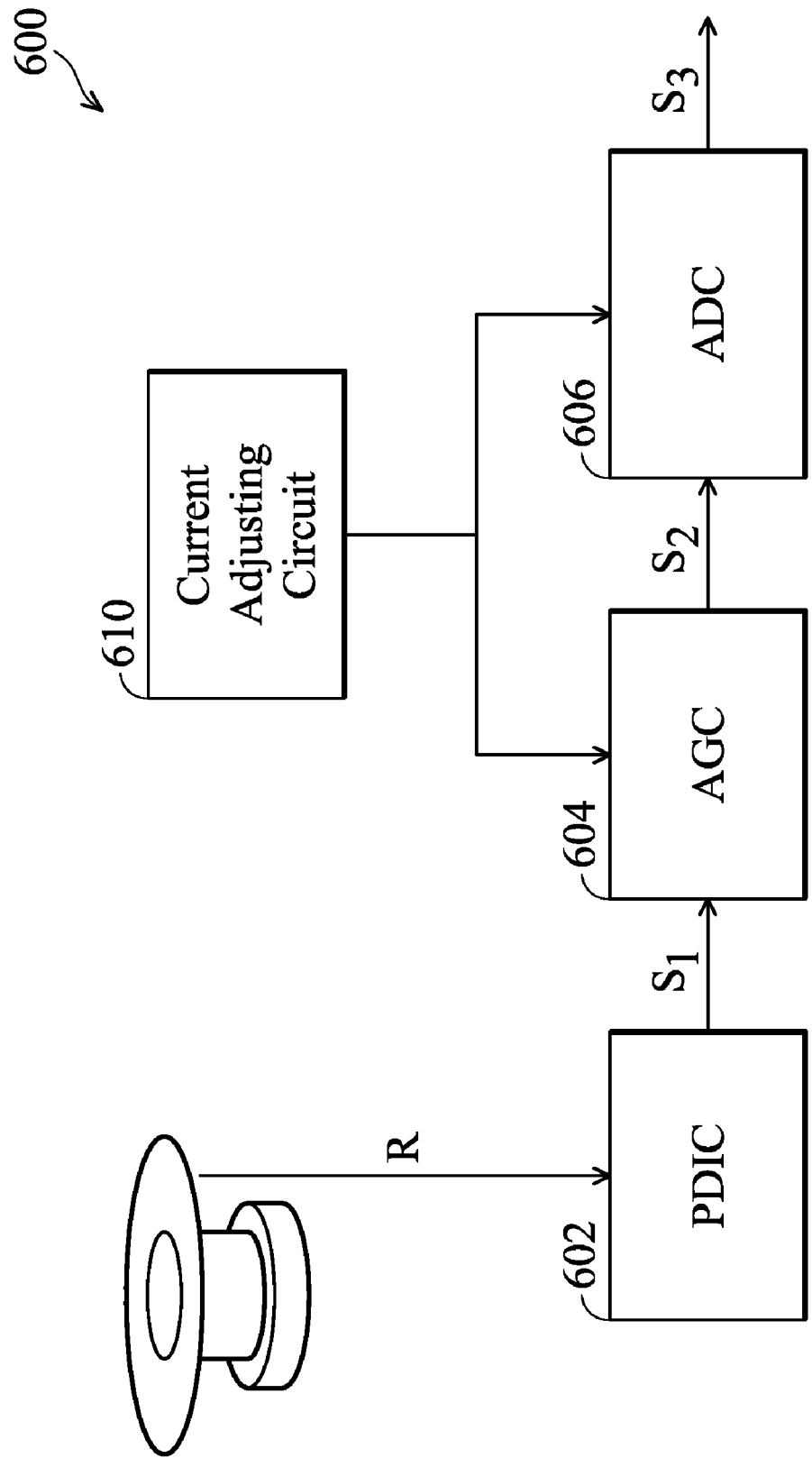
FIG. 6A is a block diagram of an optical disk drive dynamically adjusting current levels according to the invention.
Figure 6B:
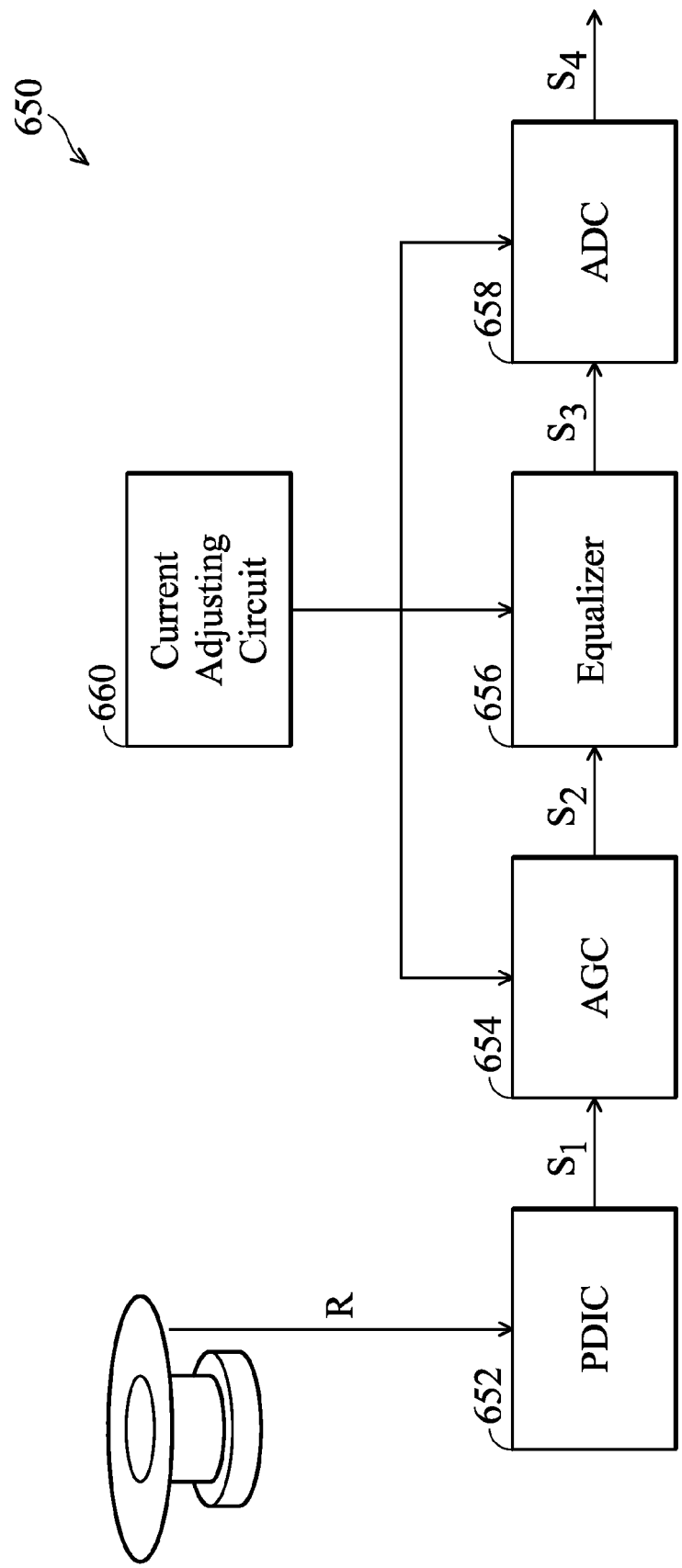
FIG. 6B is a block diagram of another embodiment of an optical disk drive dynamically adjusting current levels according to the invention.

An optical disk drive comprises many component circuits in additional to an analog-to-digital converter. The optical disk drive can also dynamically adjust the currents for driving the component circuits to reduce power consumption of the optical disk drive. Referring to FIG. 6A, a block diagram of an optical disk drive 600 dynamically adjusting current levels according to the invention is shown. In one embodiment, the optical disk drive 600 comprises a photodetector integrated circuit (PDIC) 602, an automatic gain controller (AGC) 604, an analog-to-digital converter (ADC) 606, and a current adjusting circuit 610. The photodetector integrated circuit 602 detects amplitudes of a reflection signal R from an optical disk to generate a wobble signal $S_1$. The automatic gain controller 604 then amplifies the wobble signal $S_1$ to obtain an amplified wobble signal $S_2$ (second wobble signal). The analog-to-digital converter 606 then converts the amplified wobble signal $S_2$ from analog to digital to obtain a digitized wobble signal $S_3$ (third wobble signal). The current adjusting circuit 610 then dynamically adjusts levels of currents for driving the automatic gain controller 604 and the analog-to-digital converter 606. In one embodiment, the optical disk drive 600 can further comprise an equalizer coupled between the automatic gain controller 604 and the analog-to-digital converter 606 for equalizing the wobble signal $S_2$ generated by the automatic gain controller 604, and the current adjusting circuit 610 also dynamically adjusts the level of current to drive the equalizer, such as the equalizer 656 shows in FIG. 6B.

In one embodiment, the current adjusting circuit 610 adjusts the current levels for driving the automatic gain controller 604 and the analog-to-digital converter 606 according to a media type which indicates a format of an optical disk read by the optical disk drive 600. Wobble signals retrieved from optical disks of different media types require different levels of signal processing, and the circuit components for signal processing also require different levels of driving currents. For example, the media type is selected from a DVD+R/RW format, a DVD-R/RW format, a CD-R/RW format, and a Blu-ray R/RW format. In another embodiment, the current adjusting circuit 610 adjusts the current levels for driving the automatic gain controller 604 and the analog-to-digital converter 606 according to a rotation speed of the optical disk. When the optical disk is rotated with a higher rotation speed, the wobble signal detected from the optical disk has a higher wobble frequency, and the component circuits of the optical disk drive 600 has a heavier signal processing load. The current adjusting circuit 610 therefore increases the levels of the currents for driving the component circuits when the rotation speed of the optical disk is higher. Contrarily, the current adjusting circuit 610 decreases the levels of the currents for driving the component circuits when the rotation speed of the optical disk is lower.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic apparatus, comprising: an analog-to-digital converter (ADC), converting an analog input signal to a digital output signal with a resolution having a plurality of bits, wherein the electronic apparatus is an optical disk drive; an enable device, dynamically adjusting the resolution of the analog-to-digital converter; and a controller, determining a bit number of the resolution of the analog-to-digital converter according to whether an optical disk read by the electronic apparatus is a data disk storing data or a blank disk storing no data.

2. The electronic apparatus as claimed in claim 1, wherein the electronic apparatus further comprises:
   a controller, generating an instruction signal comprising a bit number of the resolution of the analog-to-digital converter to direct the enable device to adjust the resolution of the analog-to-digital converter.

3. The electronic apparatus as claimed in claim 1, wherein the controller increases the bit number when the optical disk is the data disk, and decreases the bit number when the optical disk is the blank disk.

4. The electronic apparatus as claimed in claim 1, wherein the analog-to-digital converter comprises:
   a string resistor ladder, generating a plurality of reference voltages with levels between a positive reference voltage and a negative reference voltage;
   a plurality of comparators, comparing the analog input signal with the reference voltages to generate a plurality of comparison result bits; and
   an encoder, gathering the comparison result bits to obtain a plurality of thermal code bits, and converting the thermal code bits to obtain a binary code signal as the digital output signal.

5. The electronic apparatus as claimed in claim 4, wherein the enable device comprises:
   a plurality of multiplexers, coupled between the comparators and the encoders, duplicating the comparison result bits generated by the enabled comparators as the comparison result bits generated by the disabled comparators according to the instruction signal to obtain the whole thermal code bits to be forwarded to the encoder.

6. An electronic apparatus, comprising:
   an analog-to-digital converter (ADC), converting an analog input signal to a digital output signal with a resolution having a plurality of bits, wherein the electronic apparatus is an optical disk drive, and the digital output signal is decoded in a decoding process to obtain data;
   an enable device, dynamically adjusting the resolution of the analog-to-digital converter; and
   a controller, determining a bit number of the resolution of the analog-to-digital converter according to a wobble decoding status indicating an error rate of the decoding process.

7. The electronic apparatus as claimed in claim 6, wherein the controller generates an instruction signal comprising a the bit number of the resolution of the analog-to-digital converter to direct the enable device to adjust the resolution of the analog-to-digital converter.

8. The electronic apparatus as claimed in claim 6, wherein the controller increases the bit number when the wobble decoding status indicates the error rate is lower than a first threshold, and the controller decreases the bit number when the wobble decoding status indicates the error rate is higher than a second threshold.

9. The electronic apparatus as claimed in claim 6, wherein the analog-to-digital converter comprises:
- a string resistor ladder, generating a plurality of reference voltages with levels between a positive reference voltage and a negative reference voltage;
- a plurality of comparators, comparing the analog input signal with the reference voltages to generate a plurality of comparison result bits; and
- an encoder, gathering the comparison result bits to obtain a plurality of thermal code bits, and converting the thermal code bits to obtain a binary code signal as the digital output signal.

10. The electronic apparatus as claimed in claim 9, wherein the enable device comprises:
- a plurality of multiplexers, coupled between the comparators and the encoders, duplicating the comparison result bits generated by the enabled comparators as the comparison result bits generated by the disabled comparators according to the instruction signal to obtain the whole thermal code bits to be forwarded to the encoder.

* * * * *